(12) United States Patent
Chung (10) Patent No.: US 6,327,217 B1
(45) Date of Patent: Dec. 4, 2001

(54) VARIABLE LATENCY BUFFER CIRCUITS, LATENCY DETERMINATION CIRCUITS AND METHODS OF OPERATION THEREOF

(75) Inventor: Dae-hyun Chung, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/679,784

(22) Filed: Oct. 5, 2000

(30) Foreign Application Priority Data

Oct. 5, 1999 (KR) .................................................. 99-42877

(51) Int. Cl.[7] ........................................................ G11C 8/00
(52) U.S. Cl. ............................ 365/233; 365/194; 365/201
(58) Field of Search ........................ 365/189.05, 189.08, 365/194, 201, 233

(56) References Cited

U.S. PATENT DOCUMENTS

| | | | |
|---|---|---|---|
| 5,384,735 | 1/1995 | Park et al. | 365/189.05 |
| 5,384,750 * | 1/1995 | Lee | 365/233 |
| 5,424,983 | 6/1995 | Wojcicki et al. | 365/189.05 |
| 5,568,445 | 10/1996 | Park et al. | 365/233 |
| 5,813,023 | 9/1998 | McLaury | 711/105 |
| 5,835,444 | 11/1998 | Kim et al. | 365/233 |
| 5,933,379 * | 8/1999 | Park et al. | 365/233 |
| 6,023,177 | 2/2000 | Kim et al. | 327/142 |
| 6,157,992 * | 12/2000 | Sawada et al. | 365/233 |
| 6,192,429 * | 2/2001 | Jeong et al. | 365/189.09 |

* cited by examiner

*Primary Examiner*—Trong Phan
(74) *Attorney, Agent, or Firm*—Myers Bigel Sibley & Sajovec

(57) ABSTRACT

A variable delay buffer circuit, as might be used in a synchronous DRAM, includes a buffer circuit that receives an input signal and generates an output signal therefrom responsive to an output enable signal. An output enable signal generation circuit receives a latency indicating signal and generates the output enable signal responsive to a command signal with a delay that is based on the latency indicating signal. A latency interval definition circuit receives a clock signal and generates at least one latency interval defining signal that defines at least one latency interval. A latency indication circuit receives the at least one latency interval defining signal and a test signal that is delayed a predetermined delay with respect to the clock signal and generates the latency indicating signal therefrom. Related methods are also discussed.

42 Claims, 7 Drawing Sheets

VARIABLE LATENCY BUFFER CIRCUITS, LATENCY DETERMINATION CIRCUITS AND METHODS OF OPERATION THEREOF

BACKGROUND OF THE INVENTION

The present invention relates to memory devices and methods of operation thereof, and more particularly, to buffer circuits and methods of operation thereof.

Synchronous dynamic random access memory (SDRAM) devices typically output memory cell data in synchronization with a clock signal in response to an external command, e.g., a read command, that is received in synchronization with an external clock signal. The number of clock cycles occurring between the external command, which is synchronized with the external clock signal, and the output of data, which is synchronized with the clock signal, is often referred to as a latency number.

It may be desirable for an SDRAM device to operate over a range of clock frequencies. The maximum clock frequency of an SDRAM may be constrained by limits on minimum delay, jitter and skew of output data produced by the SDRAM. To increase the operating frequency of the SDRAM, latency in operation of output buffers may be introduced to allow sense amplifiers and other circuitry within the SDRAM to stabilize. However, when an SDRAM that operates with a latency designed for a relatively high clock frequency is operated at a relatively low clock frequency, the latency may introduce unnecessary delay in access time.

Figure 1:
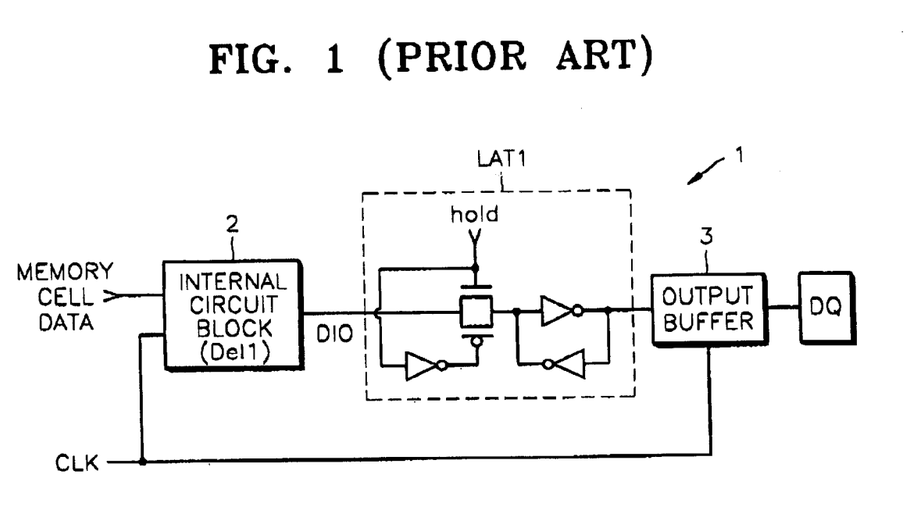
FIG. 1 is a schematic block diagram illustrating a data output circuit in a conventional SDRAM.
Figure 2:
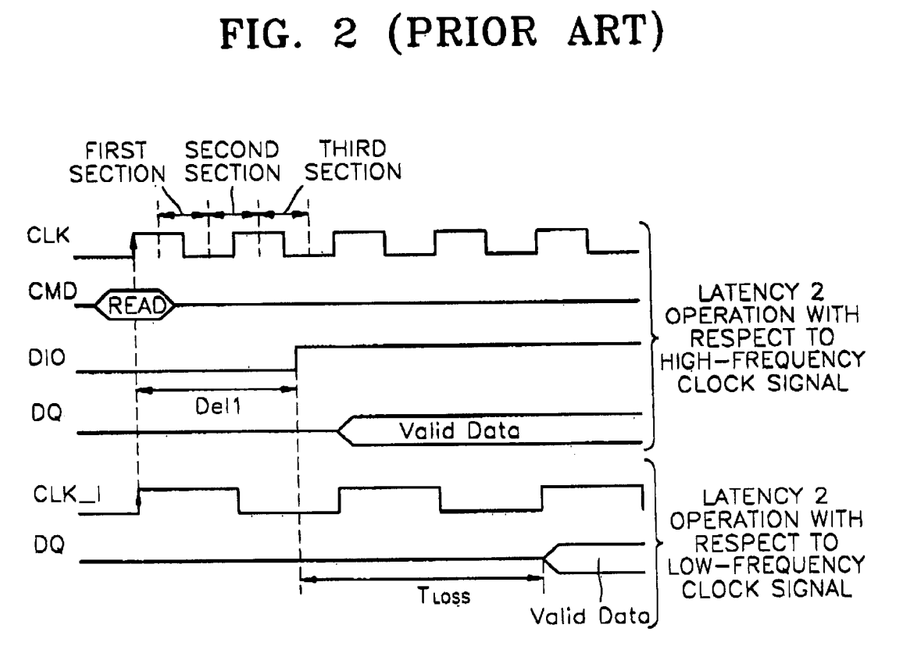
FIG. 2 is a timing diagram illustrating exemplary operations of the circuit of FIG. 1.

FIGS. 1 and 2 illustrates a part of a conventional SDRAM 1 and exemplary operations thereof. Memory cell data is transmitted through an internal circuit 2 to a data line DIO, and on to an output pad DQ via a latch circuit LAT1 and an output buffer 3. The signal applied to the output buffer is delayed by a time Del1, which is predominantly introduced by the internal circuit 2. A data hold signal hold is asserted to a logic high level, so that the memory cell data on the data line DIO is transmitted to the output buffer 3.

Referring to FIG. 2, first, second and third time intervals are defined, each corresponding to approximately a half the clock cycle of a clock signal (CLK). The first, second and third intervals denote latency intervals, i.e., latency may be determined according to which among the first, second and third intervals the delay time Del1 of FIG. 1 falls, with the first interval representing a latency of 1, the second interval representing a latency of 1.5, and the third interval representing a latency of 2. For example, as shown in FIG. 2, memory cell data having a delay time Del1 falling within the third interval following the rising edge of the clock signal CLK that coincides with a data read command READ is transmitted to the data line DIO with a latency of 2. Accordingly, valid data of the memory cell data is output to the output pad DQ two clock cycles after the rising edge of the clock signal CLK that coincides with the data read command READ.

Still referring to FIG. 2, if the SDRAM 1 that operates with a latency of 2 for a relatively high frequency clock CLK as described above is used with a lower clock frequency CLK_1, however, memory cell data which has passed through the internal circuit block 2 arrives at the data line DIO delayed by the delay time Del1 after the rising edge of a clock signal CLK_1 that coincides with the data read command READ. Under these conditions, a time loss $T_{LOSS}$ with respect to the operation with the higher frequency clock signal CLK may be incurred. This may degrade operating performance.

SUMMARY OF THE INVENTION

According to embodiments of the present invention, a latency determination circuit includes a latency interval definition circuit that receives a clock signal and that generates at least one latency interval defining signal that defines at least one latency interval. A latency indication circuit receives the at least one latency interval defining signal and a test signal that is delayed a predetermined delay with respect to the clock signal and generates a latency indicating signal therefrom. The latency determination circuit may further include a test signal generation circuit configured to receive the clock signal and operative to produce the test signal therefrom.

In some embodiments of the present invention, the test signal generation circuit is configured to receive a control signal and to generate the test signal therefrom such that the test signal is delayed the predetermined delay with respect to a next occurring feature, e.g., edge, of the clock signal following assertion of the control signal. The test signal generation circuit may include a synchronization circuit that receives the control signal and the clock signal and that generates a synchronized control signal from the control signal, and a delay circuit that produces the test signal from the synchronized control signal.

In other embodiments of the present invention, the latency interval definition circuit is operative to successively generate respective edges in respective ones of a plurality of latency interval defining signals responsive to successive edges of the clock signal. The latency interval definition circuit may be responsive to a control signal and operative to successively generate the respective edges in the respective ones of the plurality of latency interval defining signals following transition of a control signal to a predetermined logic level. In other embodiments of the present invention, the latency indication circuit is operative to assert a first latency indicating signal responsive to the test signal transitioning to a predetermined logic state before a first edge of the successively generated edges and to assert a second latency indicating signal responsive to the test signal transitioning to the predetermined logic state between the first edge and an immediately succeeding second edge of the successively generated edges.

According to still other embodiments of the present invention, a variable delay buffer circuit, as might be used in a synchronous DRAM, includes a buffer circuit that receives an input signal and generates an output signal therefrom responsive to an output enable signal. An output enable signal generation circuit receives a latency indicating signal and generates the output enable signal responsive to the command signal with a delay that is based on the latency indicating signal. A latency interval definition circuit receives a clock signal and generates at least one latency interval defining signal that defines at least one latency interval. A latency indication circuit receives the at least one latency interval defining signal and a test signal that is delayed a predetermined delay with respect to the clock signal and generates the latency indicating signal therefrom. The predetermined delay may approximate, for example, a sum of a delay associated with the buffer circuit and a delay associated with a circuit that provides the input signal to the buffer circuit.

Related methods are also discussed.

DETAILED DESCRIPTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 3:
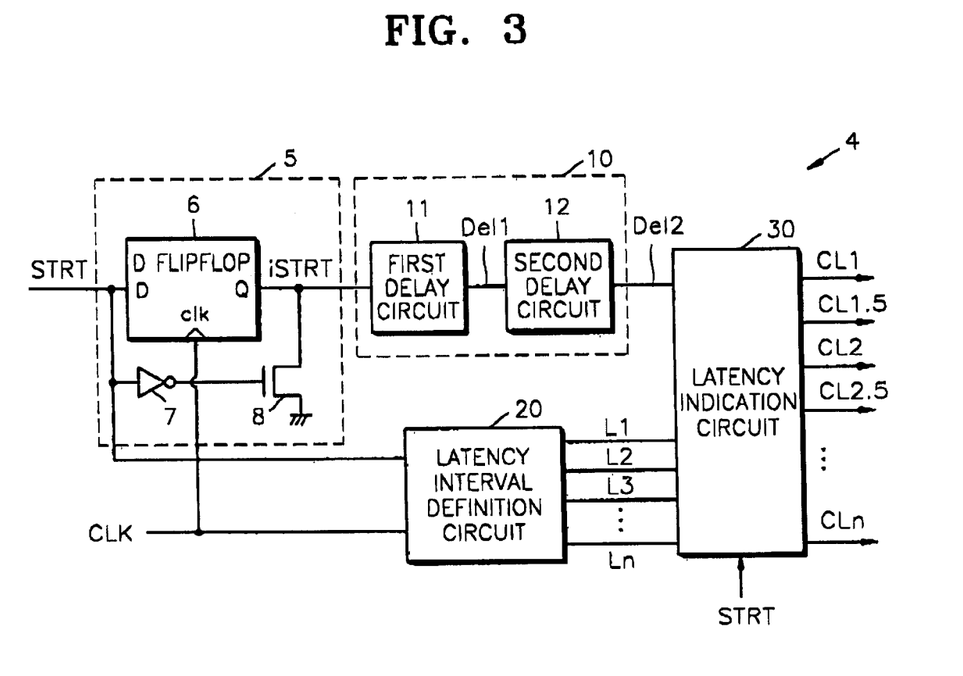
FIG. 3 is a schematic diagram illustrating a latency determination circuit according to embodiments of the present invention.

FIG. 3 illustrates a latency determination circuit 4 according to embodiments of the present invention. The latency determination circuit 4, which may be used, for example, in a memory device such as an SDRAM, includes a synchronization circuit 5, a delay circuit 10, a latency interval definition circuit 20 and a latency indication circuit 30. The synchronization circuit 5 receives a control signal STRT and generates a synchronized control signal iSTRT therefrom that is synchronized to a clock signal CLK. The control signal STRT may be provided, for example, from an external source or by the logical operation of an internal mode register that stores system application information within an SDRAM or other memory device.

As shown, the synchronization circuit 5 includes a D flip-flop 6 that receives the control signal STRT at a data input terminal D, such that the synchronized control signal iSTRT is produced at an output terminal Q of the flip-flop 6 in response to the clock signal CLK. An inverter 7 has its input terminal connected to the input terminal D of the flip-flop 6 and its output terminal connected to the gate terminal of a transistor 8. The control signal iSTRT is applied to the drain terminal of the transistor 8, and a ground voltage is applied to the source terminal of the transistor 8. When the control signal STRT is at a logic low level, the transistor 8 is turned on, forcing the synchronized control signal iSTRT to a logic low level. After the control signal STRT is asserted to a logic high level, the synchronized control signal iSTRT subsequently goes high in response to a positive-going edge of the clock signal CLK.

The delay circuit 10 receives the synchronized control signal iSTRT and generates a test signal Del2 that that is delayed a predetermined delay time. As shown, the delay circuit 10 includes a first delay circuit 11 that receives the synchronized control signal iSTRT and produces an output signal Del1 therefrom, and a second delay circuit 12 that receives the output signal Del1 and produces the test signal Del2 therefrom. The delay introduced by the first delay circuit 12 may be, for example, a time corresponding to the delay introduced by an internal circuit such as the internal circuit 2 of FIG. 1, while the delay introduced by the second delay circuit 12 may be, for example, a delay associated with other operations, such as delay introduced by an output buffer.

Figure 4:
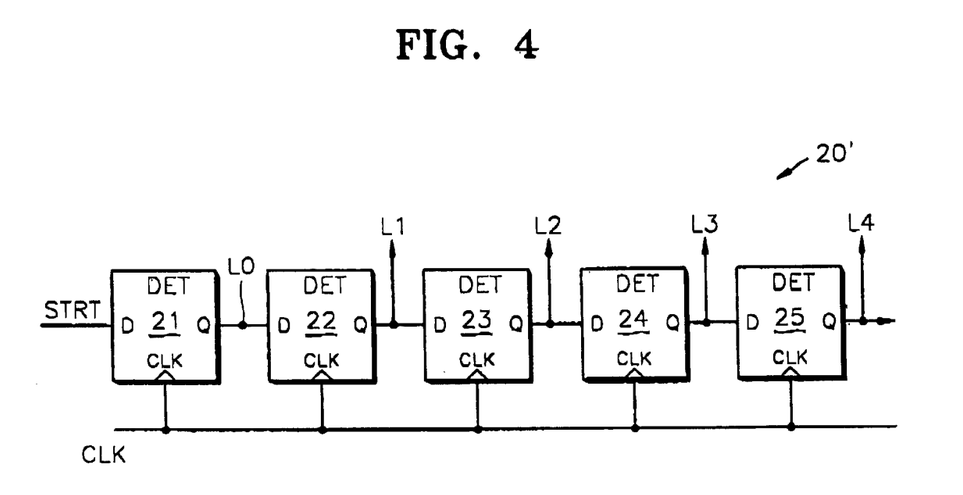
FIG. 4 is a schematic diagram illustrating a latency interval definition circuit according to embodiments of the present invention.

Still referring to FIG. 3, the latency interval definition circuit 20 receives the control signal STRT and the clock signal CLK and generates latency interval defining signals L1, L2, L3, . . . , Ln. FIG. 4 illustrates a latency interval determination circuit 20' according to embodiments of the present invention. The latency interval definition circuit 20' includes a plurality of serially connected double edge triggered (DET) flip-flops 21, 22, . . . , 25 that are clocked by the clock signal CLK. A first flip-flop 21 receives the control signal STRT at its input terminal D and produces a first latency interval defining signal L0 therefrom at its output terminal Q responsive to the clock signal CLK. A second flip-flop 22 receives the first latency interval defining signal L0 at its input terminal D, and produces a second latency interval defining signal L1 at its output terminal Q responsive to the clock signal CLK. Similarly, third, fourth and fifth flip-flops 23, 24, 25 produce third, fourth and fifth latency interval determining signals L2, L3, L4. Although FIG. 4 illustrates only five-latency interval determining signals L0, L1, L2, L3, L4, it will be appreciated that other numbers of latency interval defining signals may be produced.

Figure 5:
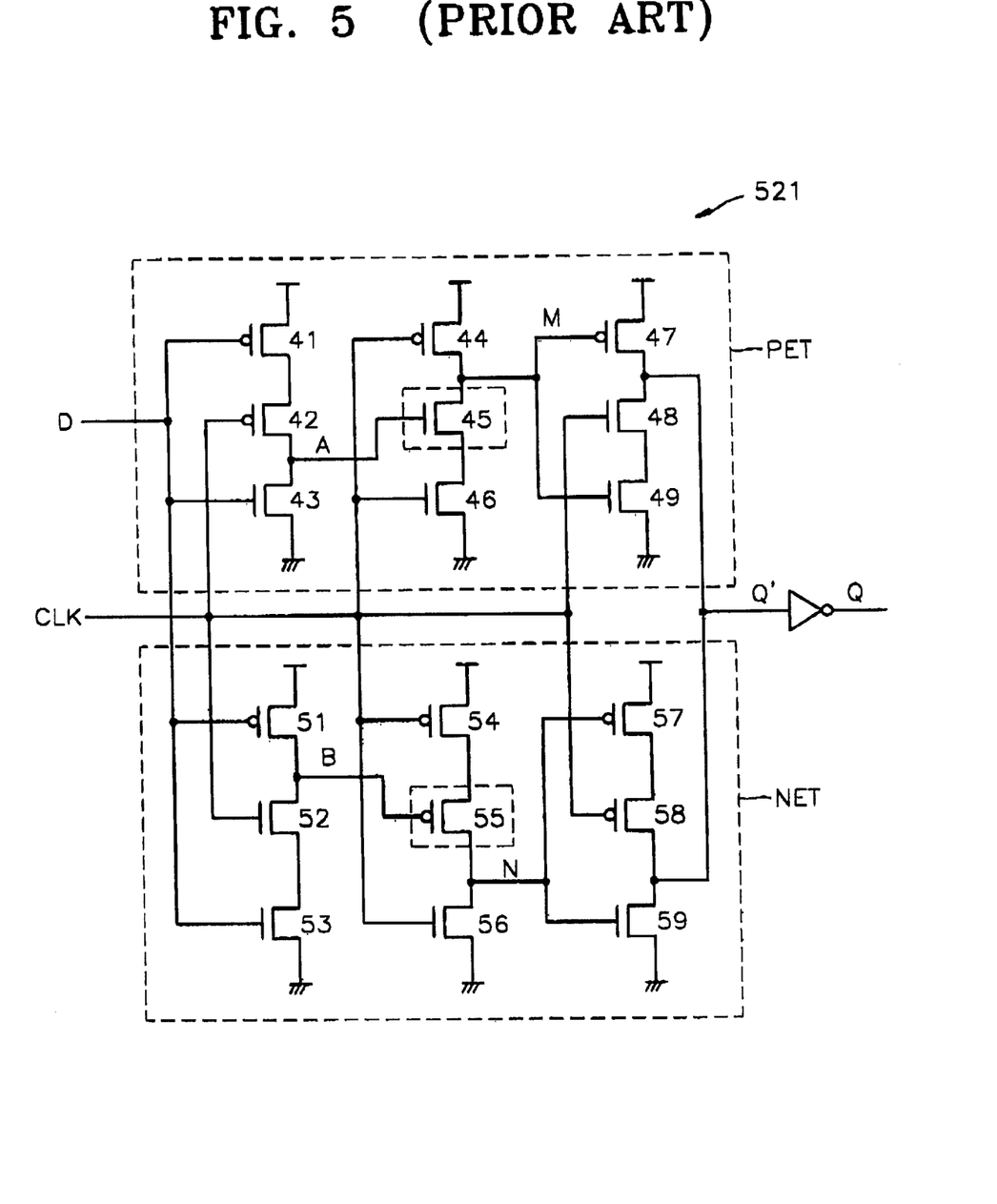
FIG. 5 is a schematic diagram illustrating a double edge triggered (DET) flip-flop according to embodiments of the present invention.

An example of a DET flip-flop circuit 521 that may be used with the present invention is shown in FIG. 5. Such a DET flip-flop circuit is described in IEEE JOURNAL OF SOLID-STATE CIRCUITS, Vol. 26, No. 8, August 1991. In the DET flip-flop circuit 521, an input terminal D and a clock signal terminal CLK are connected to a positive edge triggered circuit PET and to a negative edge triggered circuit NET. The positive edge triggered circuit PET includes transistors 41, 42, . . . , 49. The negative edge triggered circuit includes transistors 51, 52, . . . 59.

The positive edge triggered circuit PET latches the logic level at the input terminal D on a positive edge of a clock signal at the clock terminal CLK to generate an output signal at an output terminal Q. In particular, when the logic level at the input terminal D is a logic high, the transistor 43 is turned on, driving a node A to a logic low level. This turns off the transistor 45. The transistor 44 is turned on in response to a logic low level in the clock signal CLK, driving the node M to a logic high level. The transistor 44 is turned off in response to a subsequent high level for the clock signal CLK, but the node M remains at the high level state. The transistor 49 is turned on by the high level of the node M, and the logic levels of the output signals Q' and Q become a logic low level and a logic high level, respectively, in response to the logic high level for the clock signal CLK.

When the logic level of the input terminal D is a logic low, the transistor 41 is turned on, and the transistor 43 is turned off. The transistor 42 is turned on in response to a logic low level for the clock signal CLK, so that the node A is driven to a logic high level. The transistor 42 is turned off by next high level clock of the signal CLK, but the node A remains at the logic high level. The transistor 45 is turned on by the logic high level node A. The transistor 46 is turned on in response to the high level of the clock signal CLK, so that the node M is driving to a logic low level. The transistor 47 is turned on by the low level of the node M, so that the levels of the output signals Q' and Q are a logic high level and a logic low level, respectively. The negative edge triggered circuit NET latches the logic level at the input terminal D at a negative edge of the clock signal CLK. The operation of the negative edge triggered circuit NET is similar to that of the positive edge triggered circuit PET, and will not be described in further detail.

Figure 6:
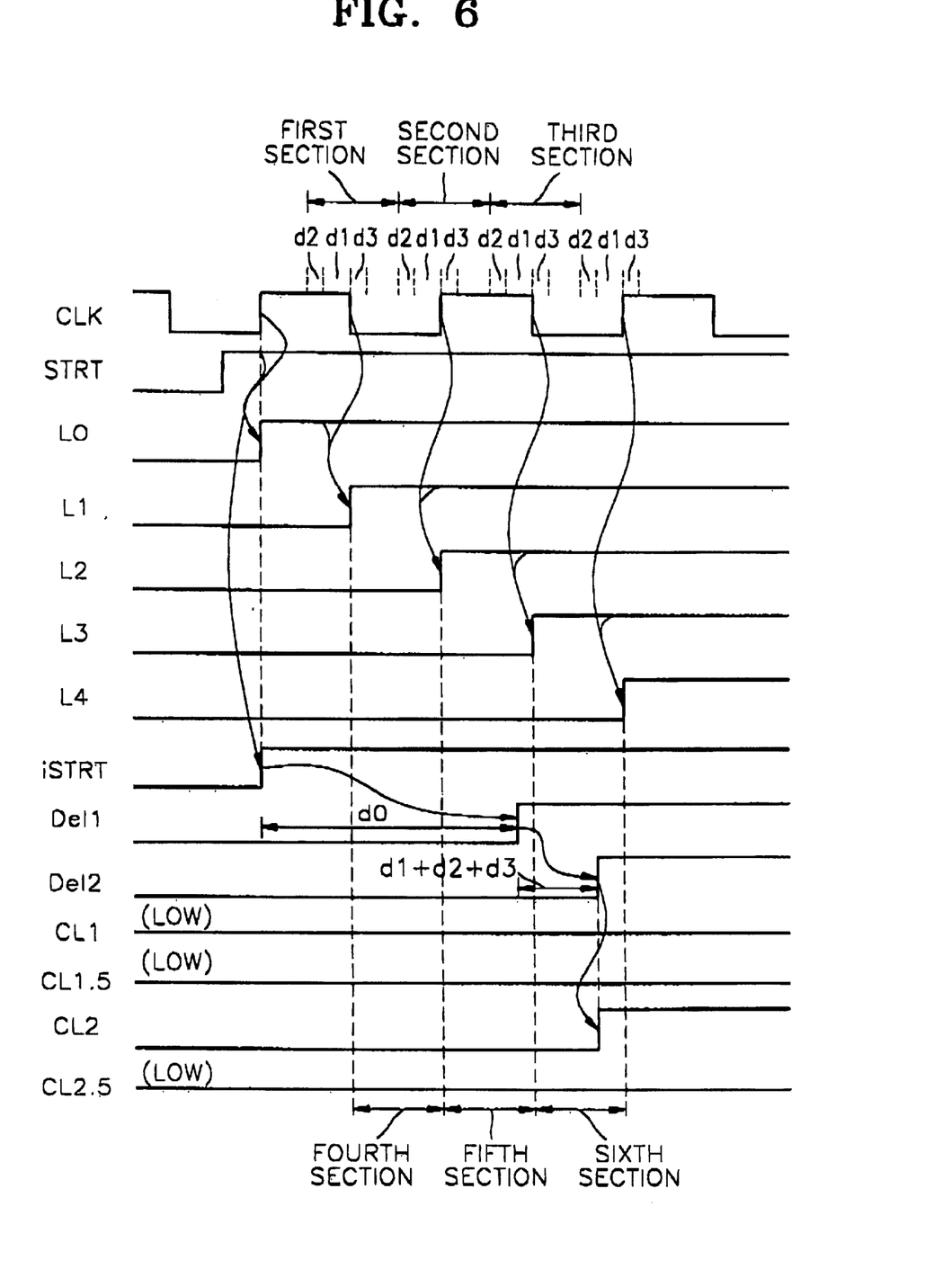
FIG. 6 is a timing diagram graphically illustrating operations of a latency determination circuit according to embodiments of the present invention.

FIG. 6 illustrates exemplary operations of the latency determination circuit 4 of FIG. 3. The logic level of the control signal STRT received by the latency interval definition circuit 20 is latched at an edge of the clock signal CLK. When the control signal STRT transitions to a high level and remains high during a subsequent positive edge of the clock signal CLK, a positive edge is generated in the first latency interval defining signal L0. In response to a subsequent negative edge of the clock signal CLK, an edge is then generated in the second latency interval defining signal L2. Edges are successively generated in respective ones of the third, fourth and fifth latency interval defining signals L2, L3, L4 upon successive edges of the clock signal CLK.

Still referring to FIG. 6, the synchronized control signal iSTRT transitions to a logic high level responsive to a high level for the control signal STRT and a positive edge of the clock signal CLK. As shown, the output signal Del1 is driven high after a delay d0, and the test signal Del2 is driven high after a delay d1+d2+d3, which may correspond a sum of a delay time d1 of an output buffer, a setup time d2 of the output buffer, and a delay time d3 of a latch included in the latency interval definition circuit 20 of FIG. 3. As shown, the test signal Del2 is driven high during a latency interval defined by the fourth and fifth latency interval defining signals L3, L4. This causes a latency-indicating signal CL2 (corresponding to a latency of 2) to be asserted by the latency indication circuit 30.

Figure 7:
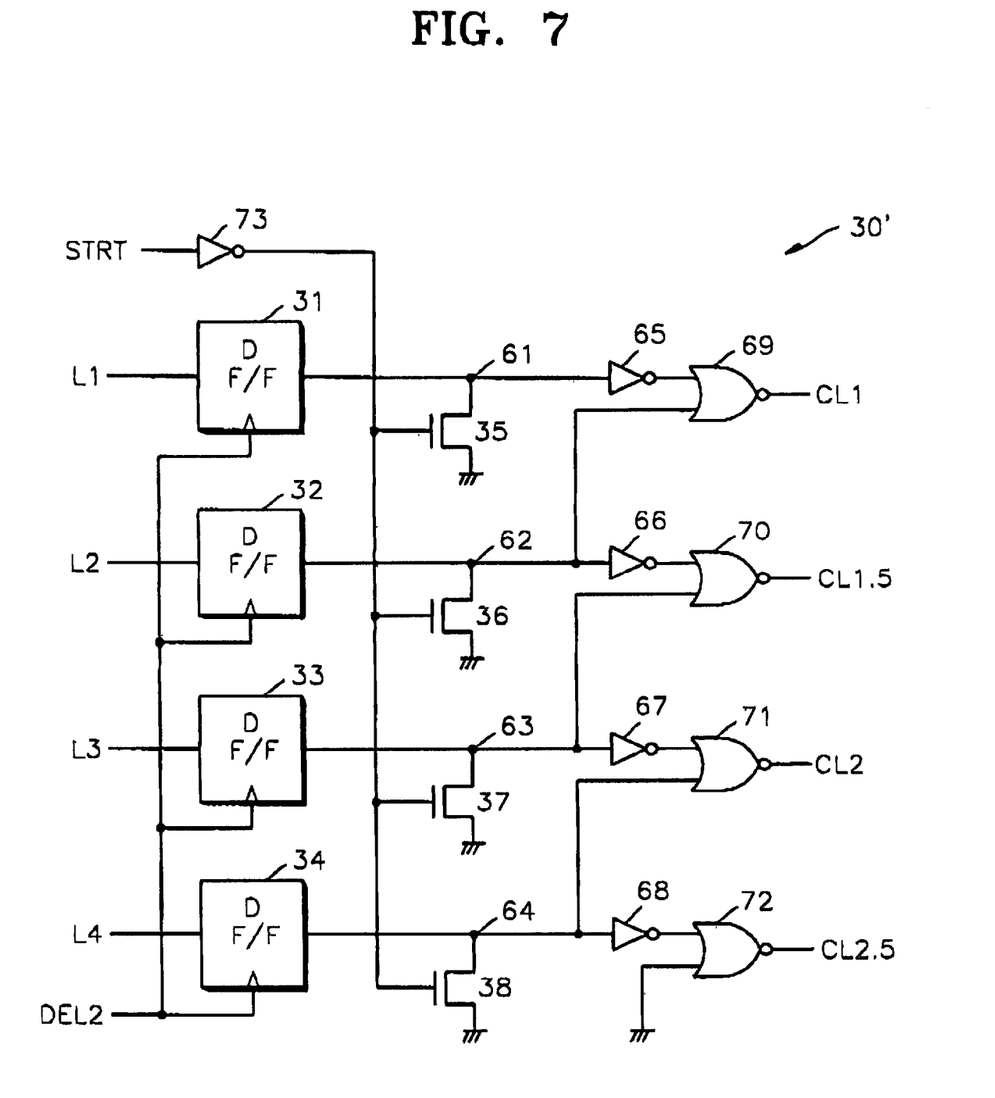
FIG. 7 is a schematic diagram illustrating a latency indication circuit according to embodiments of the present invention.

FIG. 7 illustrates a latency indication circuit 30' according to embodiments of the present invention. The latency indication circuit 30' receives the latency interval defining signals L1, L2, L3 and L4 and the test signal Del2, and generates the latency indication signals CL1, CL1.5, CL2, CL2.5 therefrom. In particular, the latency indicating circuit 30' includes D flip-flops 31, 32, 33, 34 that receive respective ones of the latency interval defining signals L1, L2, L3, L4. Respective transistors 35, 36, 37 and 38 are connected to the output nodes 61, 62, 63, 64 of the respective D-flip-flops 31, 32, 33,34. An inverter 73 receives the control signal STRT and drives the gate terminals of the transistors 35, 36, 37, 38. The output nodes 61, 62, 63, 64 of the D-flip-flops 31, 32, 33, 34 are connected to respective 2-input NOR gates 69, 70, 71, 72 via respective inverters 65, 66, 67, 68. The output nodes 62, 63, 64 of the D-flip-flops 32, 33, 34 are also connected respective ones of the 2-input NOR gates 69, 70, 71, while the 2-input NOR gate 72 is connected to a signal ground. The 2-input NOR gates 69, 70, 71, 72 produce respective ones of the latency indicating signals CL1, CL1.5, CL2, CL2.5.

Referring to FIG. 7 in conjunction with FIG. 6, when the control signal STRT is at a logic low level, the transistors 35, 36, 37, 38 are turned on, so that the output nodes 61, 62, 63, 64 of the D-flip-flops 31, 32, 33, 34 are driven to logic low levels, initializing the latency indicating signals CL1, CL1.5, CL2, CL2.5 to logic low levels. Thereafter, when the logic level of the test signal Del2 transitions to a logic high level, the D-flip-flops 31, 32, 33, 34 latch the logic levels of respective ones of the latency interval defining signals L1, L2, L3, L4. As shown in FIG. 6, when the test signal Del2 goes high, the logic levels of the latency interval defining signals L1, L2, L3 are high, such that the output nodes 61, 62, 63 of the D-flip-flops 31, 32, 33 are latched to logic high levels. However, the logic level of the latency interval defining signal L4 is low, causing the output node 64 of the D-flip-flop 64 to remain at a logic low level. This causes the third latency indicating signal CL2 to be a logic high, while the first, second and fourth latency indicating signals CL1, CL1.5, CL2.5 are at a logic low.

Figure 8:
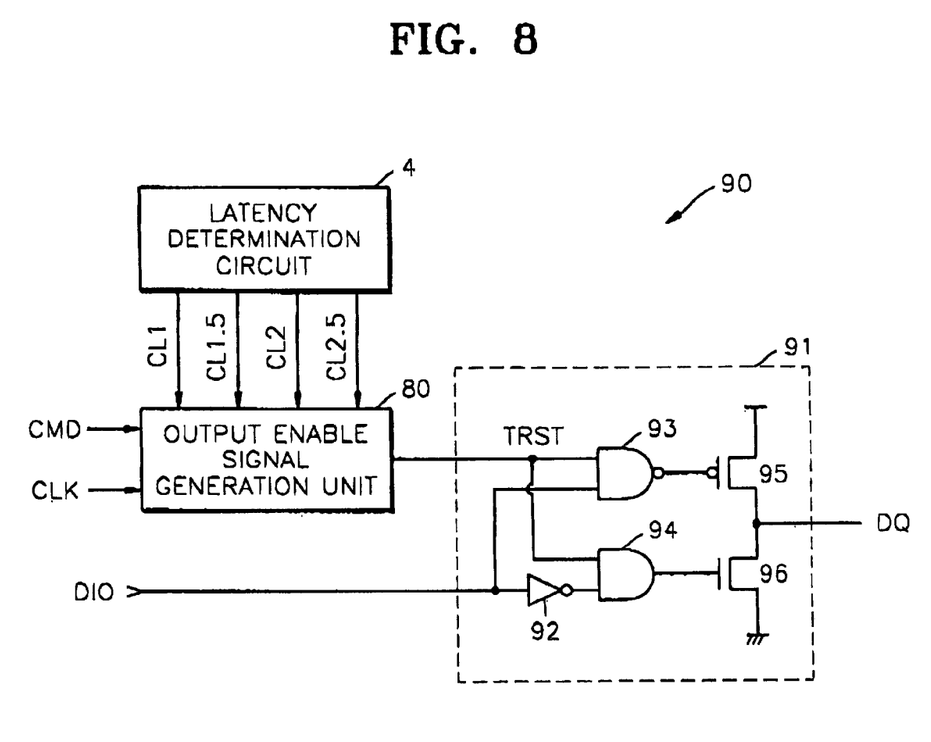
FIG. 8 is a schematic diagram illustrating a variable latency buffer circuit according to embodiments of the present invention.

FIG. 8 illustrates a variable latency buffer circuit 90 according to embodiments of the present invention. The variable latency buffer circuit 90 includes a buffer circuit 91 that receives an input signal DIO and that generates an output signal DQ therefrom responsive to an output enable signal TRST. As shown, the buffer circuit 91 includes an inverter 92 that receives the input signal DIO, a NAND gate 93 that receives the input signal DIO and the output enable signal TRST, and an AND gate 94 that receives an output signal produced by the inverter 92 and the output enable signal TRST. The NAND gate 93 produces an output signal that is applied to a gate terminal of a transistor 95, and the AND gate 94 produces an output signal that is applied to a gate terminal of a transistor 96. The variable latency buffer circuit 90 also includes an output enable signal generation circuit 80 that generates the output enable signal TRST responsive to a clock signal CLK and a command signal CMD, with a timing that is controlled responsive to a plurality of latency indicating signals CL1, CL1.5, CL2, CL2.5 generated by a latency determination circuit 4, such as the latency determination circuit 4 of FIG. 3.

Figure 10:
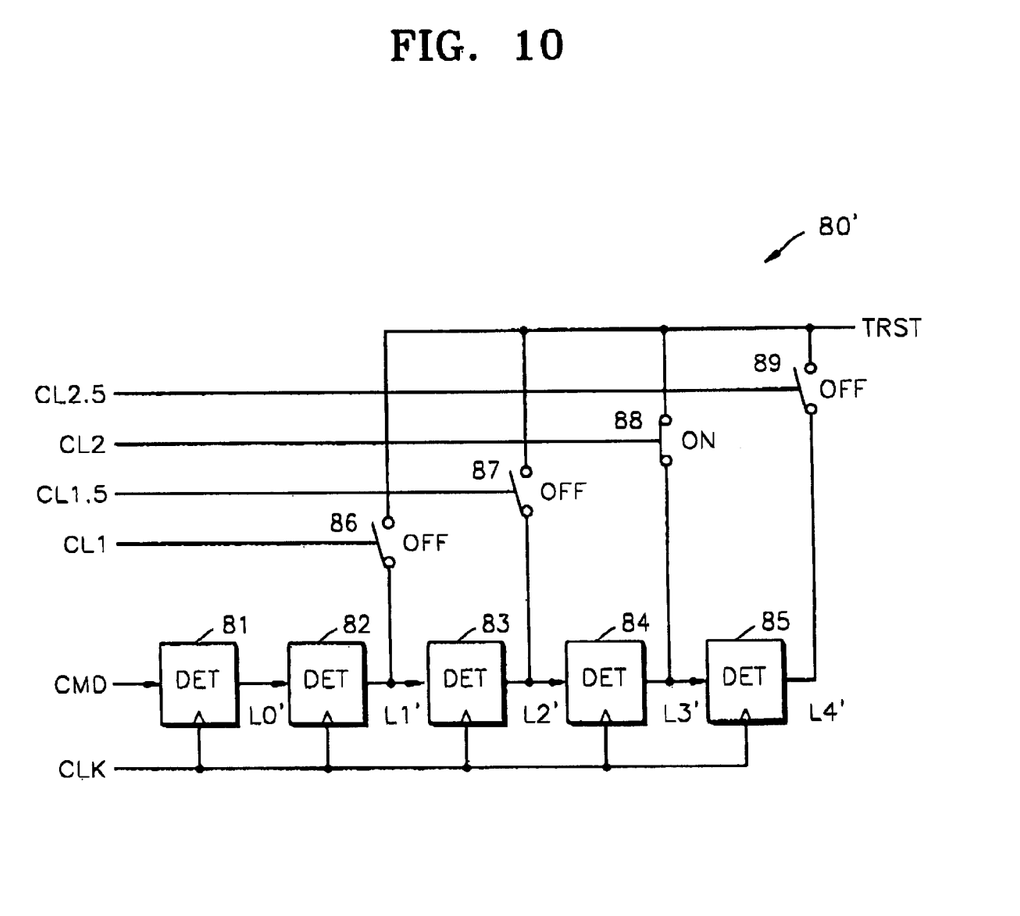
FIG. 10 is a schematic diagram illustrating an output enable signal generation circuit according to embodiments of the present invention.

FIG. 10 illustrates an output enable signal generation circuit 80' according to embodiments of the present invention. The output enable signal generation circuit 80' includes a plurality of serially connected dual edge triggered (DET) flip-flops 81, 82, . . . , 85 that are clocked by a clock signal CLK. A first flip-flop 81 receives a command signal CMD, and the serially connected flip-flops 81, 82, . . . , 85 generate respective output signals L0', L1', . . . , L4' responsive to the command signal CMD and the clock signal CLK. The output signals L1', L2', . . . , L4' are passed to respective switches 86, 87, 88, 89 that are opened and closed responsive to latency indicating signals CL1, CL1.5, CL2, CL2.5 to generate an output enable signal TRST with appropriate delay. For example, as shown, assertion of the latency indication signal CL2 closes the switch 88, causing the output enable signal TRST to be generated from the output signal L3' produced by the flip-flop 84.

Figure 9:
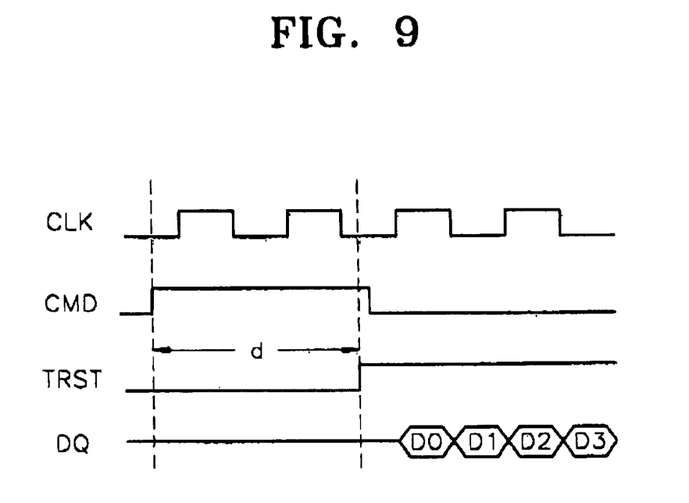
FIG. 9 is a timing diagram graphically illustrating exemplary operations of the variable latency buffer circuit of FIG. 8 according to embodiments of the present invention.

Referring now to the timing diagram of FIG. 9 in conjunction with FIG. 8, assertion of the output enable signal TRST allows data D0, D1, . . . , D3 on the data line DIO to be transferred to the output terminal DQ. The output enable signal TRST is activated in response to a command CMD, with a delay d that is controlled by the latency indicating signals CL1, CL1.5, CL2, CL,2.5, which, as described above, are generated responsive to the frequency of the clock signal CLK. Accordingly, in embodiments of the present invention, latency may be adjusted responsive to clock frequency such that unnecessary delay at lower clock frequencies may be reduced.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A latency determination circuit, comprising:
   a latency interval definition circuit that receives a clock signal and generates at least one latency interval defining signal that defines at least one latency interval; and
   a latency indication circuit that receives the at least one latency interval defining signal and a test signal that is delayed a predetermined delay with respect to the clock signal and that generates a latency indicating signal therefrom.

2. The latency determination circuit of claim 1, further comprising a test signal generation circuit configured to receive the clock signal and operative to produce the test signal therefrom.

3. The latency determination circuit of claim 2, wherein the test signal generation circuit is configured to receive a control signal and to generate the test signal therefrom such that the test signal is delayed the predetermined delay with respect to a next occurring feature of the clock signal following assertion of the control signal.

4. The latency determination circuit of claim 3, wherein the next occurring feature of the clock signal comprises an edge of the clock signal following assertion of the control signal.

5. The latency determination circuit of claim 3, wherein the test signal generation circuit comprises:
   a synchronization circuit that receives the control signal and the clock signal and that generates a synchronized control signal from the control signal; and
   a delay circuit that produces the test signal from the synchronized control signal.

6. The latency determination circuit of claim 5, wherein the synchronization circuit comprises a flip-flop that receives the control signal and that produces the synchronized control signal therefrom responsive to the clock signal.

7. The latency determination circuit of claim 1, wherein the latency interval definition circuit is operative to successively generate respective edges in respective ones of a plurality of latency interval defining signals responsive to successive edges of the clock signal.

8. The latency determination circuit of claim 7, wherein the latency interval definition circuit is responsive to a control signal and is operative to successively generate the respective edges in the respective ones of the plurality of latency interval defining signals following transition of a control signal to a predetermined logic level.

9. The latency determination circuit of claim 8, wherein the latency interval definition circuit comprises a plurality of serially-connected flip-flops, a first one of which receives a control signal and respective ones of which generate respective ones of the plurality of latency interval defining signals from the control signal responsive to the clock signal.

10. The latency determination circuit of claim 7, wherein the latency indication circuit is operative to produce a plurality of latency indicating signals.

11. The latency determination circuit of claim 10, wherein the latency indication circuit is operative to assert a first latency indicating signal responsive to the test signal transitioning to a predetermined logic state before a first edge of the successively generated edges and to assert a second latency indicating signal responsive to the test signal transitioning to the predetermined logic state between the first edge and an immediately succeeding second edge of the successively generated edges.

12. The latency determination circuit of claim 10, wherein the latency indication circuit comprises:
   a plurality of flip-flops that receive the clock signal at respective clock inputs thereof, that receive respective ones of the plurality of latency interval defining signals at respective data inputs thereof, and that generate respective output signals at respective data outputs from the respective latency interval defining signals responsive to the clock signal;
   a logic circuit that receives the plurality of output signals from the plurality of flip-flops and that generates the plurality of latency indicating signals therefrom.

13. The latency determination circuit of claim 12, wherein the logic circuit comprises:
   a first inverter coupled to a data output of a first flip-flop of the plurality of flip-flops;
   a first NOR gate coupled to an output of the first flip-flop and a data output of a second flip-flop of the plurality of flip-flops;
   a second inverter coupled to the data output of the second flip-flop; and
   a second NOR gate coupled to a data output of a third flip-flop of the plurality of flip-flops.

14. The latency determination circuit of claim 1:
   wherein the latency interval definition circuit is operative to generate an edge in a latency interval defining signal responsive to an edge of the clock signal; and wherein the latency indication circuit is operative to produce a first logic state in the latency indicating signal responsive to the test signal transitioning to a predetermined logic state before the edge of the latency interval defining signal and to produce a second logic state in the latency indicating signal responsive to the test signal transitioning to the predetermined logic state after the edge of the latency interval defining signal.

15. A variable latency buffer circuit, comprising:
   a buffer circuit that receives an input signal and generates an output signal therefrom responsive to an output enable signal;
   an output enable signal generation circuit that receives a latency-indicating signal and generates the output enable signal responsive to the command signal with a delay that is based on the latency indicating signal;
   a latency interval definition circuit that receives a clock signal and generates at least one latency interval defining signal that defines at least one latency interval; and
   a latency indication circuit that receives the at least one latency interval defining signal and a test signal that is delayed a predetermined delay with respect to the clock signal and that generates the latency indicating signal therefrom.

16. The variable latency buffer circuit of claim 15, further comprising a test signal generation circuit configured to receive the clock signal and operative to produce the test signal therefrom.

17. The variable latency buffer circuit of claim 16, wherein the test signal generation circuit is configured to receive a control signal and to generate the test signal therefrom such that the test signal is delayed the predetermined delay with respect to a next occurring feature of the clock signal following assertion of the control signal.

18. The variable latency buffer circuit of claim 15, wherein the latency interval definition circuit is operative to successively generate respective edges in respective ones of a plurality of latency interval defining signals responsive to successive edges of the clock signal.

19. The variable latency buffer circuit of claim 18, wherein the latency indication circuit is operative to produce a plurality of latency indicating signals.

20. The variable latency buffer circuit of claim 19, wherein the latency indication circuit is operative to assert a first latency indicating signal responsive to the test signal transitioning to a predetermined logic state before a first edge of the successively generated edges and to assert a second latency indicating signal responsive to the test signal transitioning to the predetermined logic state between the first edge and an immediately succeeding second edge of the successively generated edges.

21. The variable latency buffer circuit of claim 15:
wherein the latency interval definition circuit is operative to generate an edge in a latency interval defining signal responsive to an edge of the clock signal; and wherein the latency indication circuit is operative to produce a first logic state in the latency indicating signal responsive to the test signal transitioning to a predetermined logic state before the edge of the latency interval defining signal and to produce a second logic state in the latency indicating signal responsive to the test signal transitioning to the predetermined logic state after the edge of the latency interval defining signal.

22. The variable latency buffer circuit of claim 15, wherein the predetermined delay approximates a sum of a delay associated with the buffer circuit and a delay associated with a circuit that provides the input signal to the buffer circuit.

23. A memory device, comprising:
an internal circuit that generates a data signal;
a buffer circuit that receives the data signal and generates an output signal therefrom responsive to an output enable signal;
an output enable signal generation circuit that receives a latency-indicating signal and generates the output enable signal responsive to the command signal with a delay that is based on the latency indicating signal;
a latency interval definition circuit that receives a clock signal and generates at least one latency interval defining signal that defines at least one latency interval; and
a latency indication circuit that receives the at least one latency interval defining signal and a test signal that is delayed a predetermined delay with respect to the clock signal and that generates the latency indicating signal therefrom.

24. The memory device of claim 23, further comprising a test signal generation circuit configured to receive the clock signal and operative to produce the test signal therefrom.

25. The memory device of claim 23, wherein the latency interval definition circuit is operative to successively generate respective edges in respective ones of a plurality of latency interval defining signals responsive to successive edges of the clock signal.

26. The memory device of claim 25, wherein the latency indication circuit is operative to assert a first latency indicating signal responsive to the test signal transitioning to a predetermined logic state before a first edge of the successively generated edges and to assert a second latency indicating signal responsive to the test signal transitioning to the predetermined logic state between the first edge and an immediately succeeding second edge of the successively generated edges.

27. The memory device of claim 23:
wherein the latency interval definition circuit is operative to generate an edge in a latency interval defining signal responsive to an edge of the clock signal; and
wherein the latency indication circuit is operative to produce a first logic state in the latency indicating signal responsive to the test signal transitioning to a predetermined logic state before the edge of the latency interval defining signal and to produce a second logic state in the latency indicating signal responsive to the test signal transitioning to the predetermined logic state after the edge of the latency interval defining signal.

28. The memory device of claim 23, wherein the predetermined delay approximates a sum of a delay associated with the buffer circuit and a delay associated with the internal circuit.

29. A latency determination circuit, comprising:
a synchronization circuit that generates a synchronized control signal that is synchronized with a clock signal from a control signal applied thereto;
a latency interval definition circuit that generates a plurality of latency interval defining signals in synchronization with the clock signal responsive to the control signal;
a delay circuit that receives the synchronized control signal and generates a test signal therefrom that is delayed a predetermined delay; and
a latency indication circuit that generates a plurality of latency indicating signals responsive to the latency interval defining signals and the test signal.

30. The latency determination circuit of claim 29, wherein the predetermined delay approximates a sum of a delay time of a buffer circuit of the SDRAM, a setup time of the buffer circuit, and a delay time of a latch circuit that provides an input signal to the buffer circuit.

31. The latency determination circuit of claim 29, wherein the latency indicating signals are provided to the buffer circuit.

32. The latency determination circuit of claim 29, wherein the synchronization circuit comprises:
a D flip-flop that receives the control signal and that produces the synchronized control signal therefrom;
an inverter that receives the control signal and produces an output signal therefrom; and
a transistor that deactivates the synchronized control signal responsive to the output signal of the inverter.

33. The latency determination circuit of claim 29, wherein the latency interval definition circuit comprises a plurality of serially connected double edge triggered (DET) flip-flops clock by the clock signal, respective ones of which produce respective ones of the latency interval defining signals.

34. The latency determination circuit of claim 33, wherein the DET flip-flops latch logic levels at their inputs in response to rising and falling edges of the clock signal.

35. A method of determining latency, comprising:
generating at least one latency interval defining signal from a clock signal, the at least one latency interval definition signal defining at least one latency interval; and
generating a latency indicating signal from the at least one latency interval defining signal and from a test signal that is delayed with respect to the clock signal by a predetermined delay.

36. The method of claim 35, further comprising generating the test signal from the clock signal.

37. The method of claim 35, wherein generating the at least one latency interval defining signal comprises successively generating respective edges in respective ones of a plurality of latency interval defining signals responsive to successive edges of the clock signal.

38. The method of claim 37, wherein generating a latency indicating signal comprises:
   asserting a first latency indicating signal responsive to the test signal transitioning to a predetermined logic state before a first edge of the successively generated edges; and
   asserting a second latency-indicating signal responsive to the test signal transitioning to the predetermined logic state between the first edge and an immediately succeeding second edge of the successively generated edges.

39. The method of claim 35:
   wherein generating at least one latency interval defining signal comprises generating an edge in a latency interval defining signal responsive to an edge of the clock signal; and
   wherein generating a latency indicating signal comprises:
      producing a first logic state in the latency indicating signal responsive to the test signal transitioning to a predetermined logic state before the edge of the latency interval defining signal; and
      producing a second logic state in the latency-indicating signal responsive to the test signal transitioning to the predetermined logic state after the edge of the latency interval defining signal.

40. A method of determining a latency in a synchronous DRAM (SDRAM), the method comprising:
   generating a synchronized control signal in response to a control signal in synchronism with a clock signal;
   generating a plurality of latency interval defining signals responsive to the clock signal and the control signal;
   producing a test signal that is delayed with respect to the synchronized control signal by a predetermined delay responsive to the synchronized control signal; and
   generating a plurality of latency indicating signals responsive to the latency interval defining signals and the test signal.

41. The method of claim 40, further comprising generating an output enable signal for a buffer circuit of the SDRAM responsive to the latency indicating signals.

42. The method of claim 41, wherein the predetermined delay approximates a sum of a delay time of the buffer circuit, a setup time of the buffer circuit, and a delay time of a latch circuit that provides an input signal to the buffer circuit.

* * * * *